(12) United States Patent
Sapra et al.

(10) Patent No.: US 9,117,759 B2
(45) Date of Patent: Aug. 25, 2015

(54) METHODS OF FORMING BULB-SHAPED TRENCHES IN SILICON

(75) Inventors: Sanjeev Sapra, Boise, ID (US);
Cheng-Shun Chen, Boise, ID (US);
Hung-Ming Tsai, Boise, ID (US);
Sheng-Wei Yang, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 526 days.

(21) Appl. No.: 13/206,907

(22) Filed: Aug. 10, 2011

(65) Prior Publication Data
US 2013/0037919 A1  Feb. 14, 2013

(51) Int. Cl.
| | |
|---|---|
| *H01L 21/3205* | (2006.01) |
| *H01L 21/306* | (2006.01) |
| *H01L 21/02* | (2006.01) |
| *H01L 21/308* | (2006.01) |
| *H01L 21/311* | (2006.01) |
| *B82Y 30/00* | (2011.01) |

(52) U.S. Cl.
CPC .... *H01L 21/30604* (2013.01); *H01L 21/02238* (2013.01); *H01L 21/3083* (2013.01); *H01L 21/31111* (2013.01); *B82Y 30/00* (2013.01)

(58) Field of Classification Search
USPC ............ 257/330, E21.428, 21.231, E21.429; 438/589, 700, 585, 739
See application file for complete search history.

(56) References Cited

U.S. PATENT DOCUMENTS

| | | | |
|---|---|---|---|
| 4,149,906 A * | 4/1979 | De La Moneda | 438/325 |
| 6,406,551 B1 * | 6/2002 | Nelson et al. | 134/3 |
| 6,878,578 B1 | 4/2005 | Twu et al. | |
| 7,235,495 B2 | 6/2007 | Wagener | |
| 7,696,569 B2 | 4/2010 | Fujimoto et al. | |
| 7,799,641 B2 | 9/2010 | Lee et al. | |
| 7,838,405 B2 | 11/2010 | Lee | |
| 7,858,477 B2 | 12/2010 | Kim | |
| 7,910,438 B2 | 3/2011 | Cho et al. | |
| 2001/0028075 A1 * | 10/2001 | Chen et al. | 257/296 |
| 2003/0042631 A1 * | 3/2003 | Nelson et al. | 261/121.1 |
| 2005/0215063 A1 | 9/2005 | Bergman | |
| 2006/0141712 A1 * | 6/2006 | Chun | 438/270 |
| 2007/0123014 A1 * | 5/2007 | Han et al. | 438/585 |
| 2007/0224763 A1 * | 9/2007 | Fujimoto et al. | 438/259 |
| 2007/0284650 A1 | 12/2007 | Willer | |
| 2008/0081449 A1 * | 4/2008 | Cho et al. | 438/589 |
| 2010/0159683 A1 | 6/2010 | Lee et al. | |

OTHER PUBLICATIONS

Fink et al., Silicon Oxidation by Ozone, J. Phys,: Condens. Matter, vol. 21 (2009), 19 pages.

* cited by examiner

*Primary Examiner* — Thomas L Dickey
(74) *Attorney, Agent, or Firm* — TraskBritt

(57) ABSTRACT

A method of creating a trench having a portion of a bulb-shaped cross-section in silicon is disclosed. The method comprises forming at least one trench in silicon and forming a liner in the at least one trench. The liner is removed from a bottom surface of the at least one trench to expose the underlying silicon. A portion of the underlying exposed silicon is removed to form a cavity in the silicon. At least one removal cycle is conducted to remove exposed silicon in the cavity to form a bulb-shaped cross-sectional profile, with each removal cycle comprising subjecting the silicon in the cavity to ozonated water to oxidize the silicon and subjecting the oxidized silicon to a hydrogen fluoride solution to remove the oxidized silicon. A semiconductor device structure comprising the at least one trench comprising a cavity with a bulb-shaped cross-sectional profile is also disclosed.

21 Claims, 6 Drawing Sheets

METHODS OF FORMING BULB-SHAPED TRENCHES IN SILICON

TECHNICAL FIELD

Embodiments of the present disclosure relate to semiconductor fabrication and, more specifically, to methods of etching silicon.

BACKGROUND

Silicon wafer etching is an important act in the manufacturing of semiconductor devices. As the size of semiconductor device structures decreases, it is desirable to form narrow trenches in silicon, in which the silicon etch rate and the resulting shape of the trench are controlled. Various wet etch chemistries have conventionally been used to etch silicon. For example, when an isotropic etch is desired, silicon is etched with a mixture of nitric acid ($HNO_3$) and hydrofluoric acid (HF). In some cases, water is used to dilute the etchant solution. Typically, acetic acid ($CH_3COOH$) is used as a buffering agent for such an etchant solution.

The drawbacks of using solutions of $HNO_3$ and HF to etch silicon include the difficulty of controlling the consumption of reactants and the evolution of nitrous oxides as they dissolve into the etchant solution. The nitrous oxides dissolved in the etchant solution have a tendency to "poison" the etchant solution by saturation, affecting subsequent etches and etch rates. The process is difficult to control when forming uniform shapes in the silicon in which the size of the etched shape must be precisely controlled. When isotropically etching with $HNO_3$ and HF, if the solution is not distributed uniformly across the silicon, the resulting etch may be non-uniform. Because the oxidizer ($HNO_3$) and the etchant (HF) are in the same solution, it is difficult to finely control how much oxidation of the silicon and subsequent etching takes place at any given time. Once the silicon is oxidized, the silicon oxide may immediately be etched by the same solution and the process of oxidation and etching can repeat itself very rapidly. Thus, these solutions may result in non-uniform etches, undercutting, and pitting of the silicon. Furthermore, because $HNO_3$ and HF etchant solutions require long exposure times to etch the silicon, the process has a tendency to damage other exposed materials, such as liners, on the semiconductor device structures. The use of conventional $HNO_3$ and HF etchant solutions result in undercutting of the silicon and the formation of non-uniformly sized trenches, as shown in FIG. 1. In addition, the conventional $HNO_3$ and HF etchant solutions may remove other exposed materials, such as silicon oxide or silicon nitride, in addition to the silicon. Etchant solutions other than $HNO_3$ and HF, such as alkaline chemistries including KOH, $NH_4OH$, TMAH, or NaOH, result in the formation of sharp corners in the silicon, as shown in FIG. 2, due to a preferential etch in the direction of the crystalline orientation of the substrate. Furthermore, the $HNO_3$ and HF may remove too much silicon, such that adjacent trenches may touch, resulting in poor isolation of features formed in the trenches. The sharp corners increase the likelihood of electrical implications in the semiconductor device and can lead to component failure.

It would be desirable to be able to create substantially uniformly shaped trenches in a semiconductor device structure while controlling the selectivity of the etchant solution relative to other exposed materials. Further, it would be desirable to use an etchant solution by which the size and shape of the trenches may be accurately controlled.

DETAILED DESCRIPTION

Figure 1:
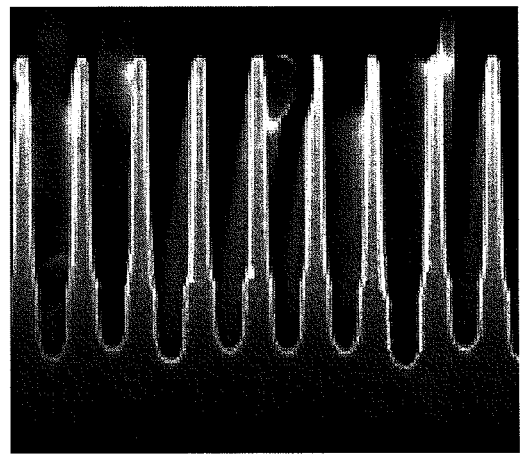
FIG. 1 is a scanning electron micrograph (SEM) illustrating trenches formed in silicon according to the prior art.

The present disclosure relates generally to methods of forming at least one trench in silicon, the at least one trench having a portion of a bulb-shaped cross-section. Thus, the portion of the trench has a cross-sectional profile in which sidewalls and an adjacent bottom surface are substantially rounded. The bulb-shaped cross-section of the portion of the trench is formed by removing silicon from a region adjacent the trench, such as by oxidizing the silicon and subsequently removing the oxidized silicon. More particularly, the silicon is oxidized using a mixture of deionized water (DI $H_2O$) and ozone ($O_3$), referred to herein as ozonated water, followed by removing the oxidized silicon using a solution of hydrofluoric acid (HF), such as an aqueous HF solution. The oxidation and removal are performed sequentially to control the amount of silicon removed, producing the desired bulb-shaped cross-section in the trenches. The solution of HF isotropically etches the oxidized silicon, forming the bulb-shaped cross-section of the portion in the trench. At least one removal cycle of oxidizing the silicon using ozonated water and removing the oxidized silicon using the solution of HF, may be conducted to form the bulb-shaped cross-section. The removal cycles may be repeated until the desired bulb-shaped cross-section of the trench portion is achieved. By controlling the number of removal cycles conducted, the bulb-shaped cross-section may be formed in a desired shape and desired dimensions. The oxidation and removal may remove the silicon without substantially removing other exposed materials, such as silicon oxides or silicon nitrides.

The term "silicon" as used in the following description means and includes any material that includes the element silicon or a compound of silicon. The silicon may be a conventional silicon wafer or other bulk substrate comprising a layer of silicon. The silicon may include monocrystalline silicon, polysilicon, or combinations thereof, which may be doped or undoped. The silicon may have any crystal orientation.

The following description provides specific details, such as material types and processing conditions in order to provide a thorough description of the embodiments of the present disclosure. A person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional semiconductor fabrication techniques.

A method of removing silicon to create a desired cross-sectional profile of trenches in the silicon according to the present disclosure is described below. More particularly, creating a uniform trench profile with a bulb-shaped cross-sectional portion is described. With the description as provided below, it will be readily apparent to one of ordinary skill in the art that the process described herein may be used in various applications. In other words, the process may be used whenever it is desired to selectively remove silicon and form uniform trenches in the silicon. By way of example, the present disclosure may be used in the formation of trenches in the silicon having good isolation between adjacent trenches, such as may be desirable in the formation of dynamic random-access memory (DRAM) devices. Features, such as date/sense lines (e.g., bitlines), may subsequently be formed in the trenches. Due to the bulb-shaped cross-section of the trenches, the bit lines may be more effectively isolated from one another.

Figure 3:
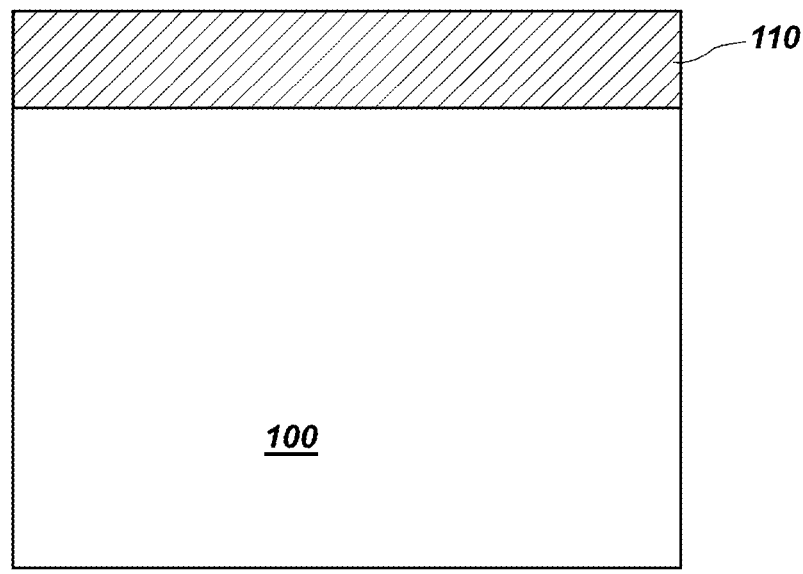
FIGS. 3 through 8 illustrate an embodiment of a method of the present disclosure for forming bulb-shaped trenches in silicon.

Referring to FIG. 3, a mask 110 is formed over silicon 100. The silicon 100 may be formed by methods known in the art, which are not described in detail herein. The mask 110 may be formed from a nitride material, an oxide material, or a combination of an oxide material and a nitride material. In one embodiment of the present disclosure, the mask 110 is formed from silicon oxide. The mask 110 may be formed by methods known in the art, such as by a thermal growth process, chemical vapor deposition (CVD), plasma-enhanced chemical vapor deposition (PECVD), or low-pressure chemical vapor deposition (LPCVD). A photoresist (not shown) may be formed over the mask 110 by methods known in the art, which are not described in detail herein. The photoresist may be patterned by conventional techniques, such as photolithography or other lithographic or non-lithographic techniques, to form at least one opening in the photoresist.

Figure 4:
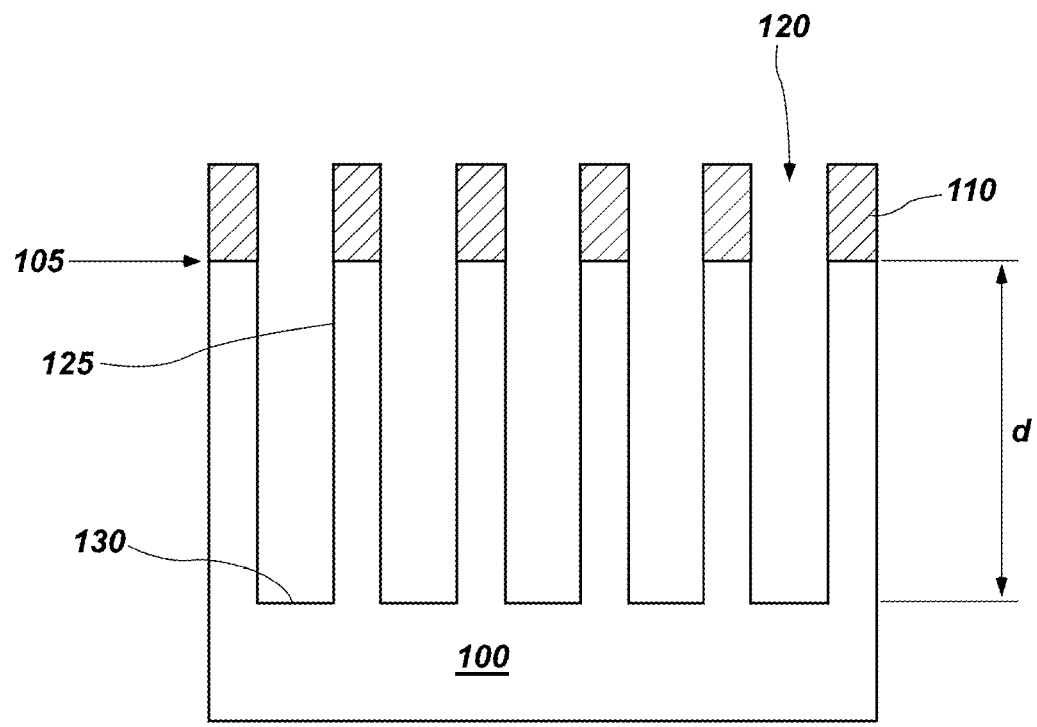

Referring to FIG. 4, a portion of the mask 110 and the silicon 100 underlying the openings in the photoresist may be removed to form at least one trench 120 having sidewalls 125 and a bottom surface 130. Alternatively, a plurality of mutually adjacent, parallel trenches 120 with sidewalls 125 perpendicular to a surface of the silicon 100 may be formed. The sidewalls 125 of the silicon 100 may be substantially vertical. The trenches 120 may be spaced apart from one another a distance of from about 40 nm to about 100 nm. Alternatively, the trenches 120 may be spaced less than 40 nm apart. The trenches 120 may have a width of from about 20 nm to about 60 nm. Alternatively, the trenches 120 may have a width of less than 20 nm. In one embodiment, the distance between adjacent trenches 120 is 60 nm and the width of each trench 120 is 40 nm. Alternatively, the trenches 120 may be formed in the silicon 100 without using mask 110. The trenches 120 may be formed by patterning a photoresist formed directly over the silicon 100 and transferring the pattern to the silicon 100.

The photoresist may be removed during the removal of the silicon 100 or mask 110 to form the trenches 120. The mask 110 may, optionally, be removed. It will be understood by one of ordinary skill in the art that any method of forming trenches 120 having sidewalls 125 may be utilized. By way of example, the trenches 120 may be formed utilizing a dry anisotropic etching chemistry. Alternatively, a directional etching process, such as plasma etching or reactive ion etching (RIE), may be used to form the trenches 120.

Referring to FIG. 4, each trench 120 may extend into the silicon 100 a selected depth, d, depending on the semiconductor device structure to be formed. In one embodiment of the present disclosure, each trench 120 has a depth, d, of about 180 nm from an interface 105 of the mask 110 and the silicon 100.

Figure 5:
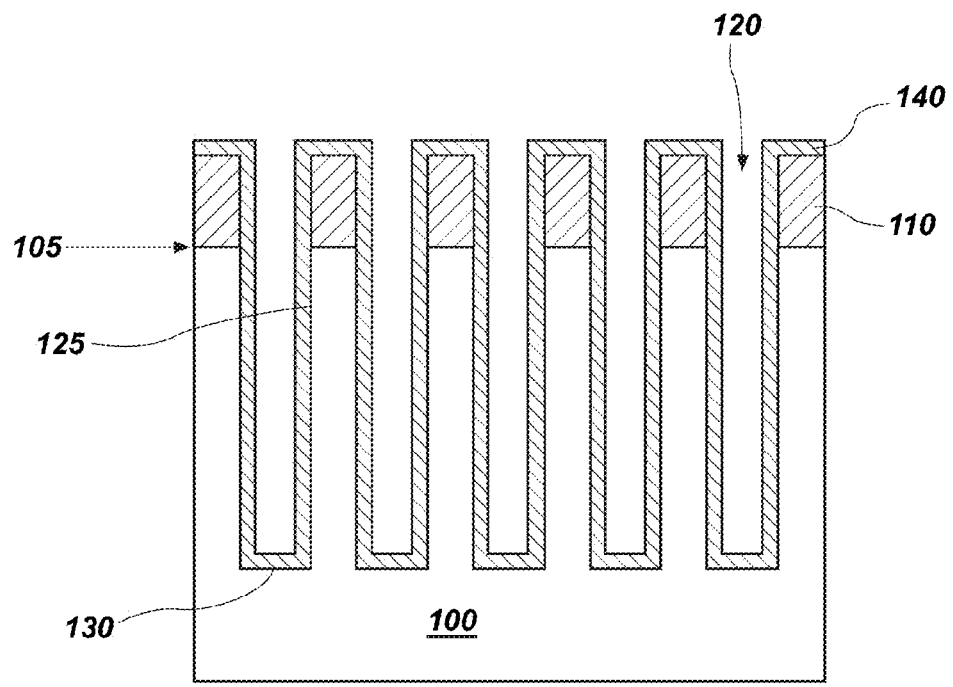

Referring to FIG. 5, a liner 140 may be formed overlying the sidewalls 125 of the trenches 120. The liner 140 may be conformally deposited over the mask 110, if present, and over the silicon 100. The liner 140 may be formed from, among other materials, an oxide material or a nitride material, such as silicon oxide or silicon nitride. The liner 140 may be formed by conventional techniques known in the art such as thermal oxidation, atomic layer deposition (ALD), CVD, PECVD, or LPCVD. The liner 140 may function as a barrier to prevent oxidation and removal of the silicon 100 during subsequent portions of the process, thus protecting and maintaining the profile of the trenches 120. The liner 140 protects the sidewalls 125 of the trenches 120 and helps to maintain their uniformity across the silicon 100. The liner 140 may prevent the silicon 100 over which it is formed from being oxidized and removed during later processing. The liner 140 may have a thickness ranging from about 50 Angstroms (Å) to about 100 Å.

Figure 6:
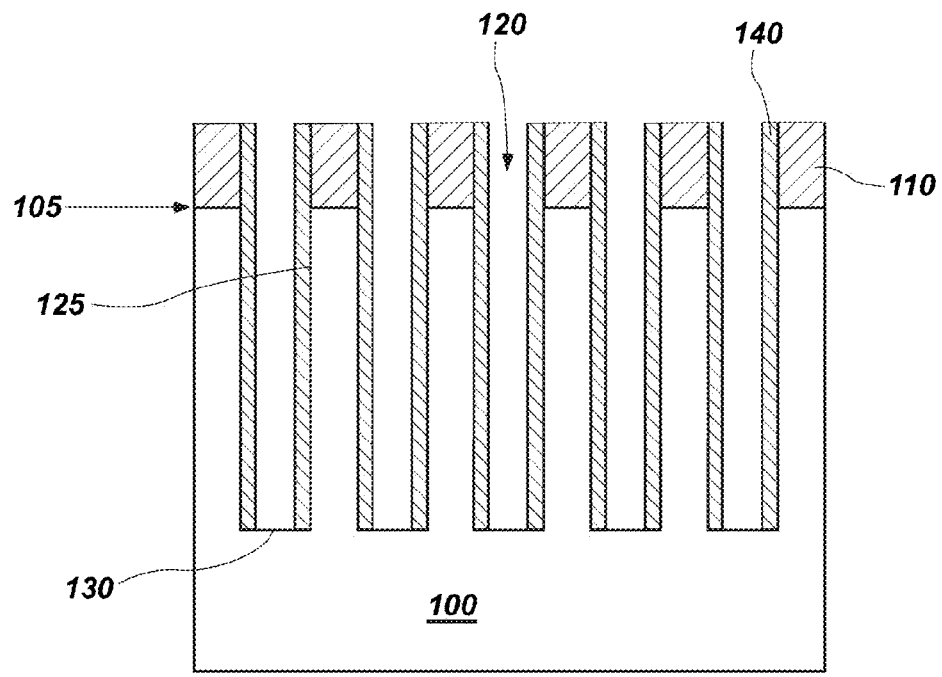

Referring to FIG. 6, a horizontal, bottom portion of the liner 140 may be removed from the bottom surface 130 of the trench 120 to expose the underlying silicon 100. Removal of the liner 140 from the bottom surface 130 of the trench 120 exposes the silicon 100 at the bottom surface of the trench 120 while the liner 140 on the sidewalls 125 of the trench 120 remains. Additionally, a directional etch may be used to remove excess material from horizontal, top portions of the liner 140 by using an isotropic etch process or an abrasive planarization technique, such as a chemical-mechanical planarization (CMP) process, as known by one of ordinary skill in the art.

Figure 7:
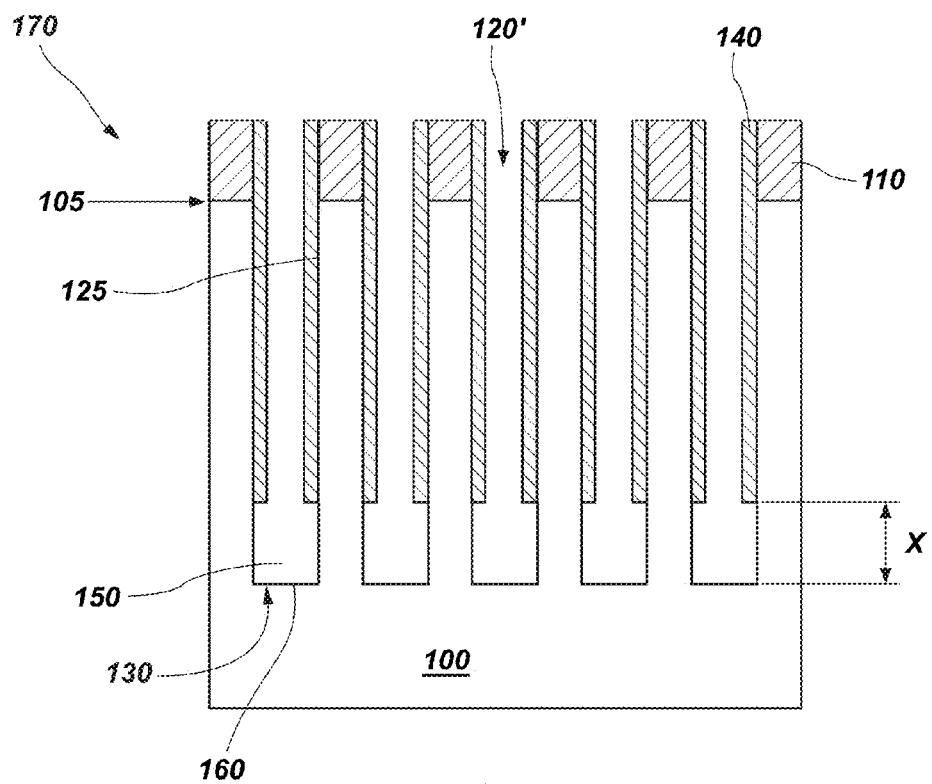

Referring to FIG. 7, a portion of the silicon 100 exposed in the trench 120 (e.g., exposed at the bottom surface 130 of the trench 120 between portions of the liner 140) may be removed, such as by an anisotropic etch process. The depth of the trench 120 may be anisotropically etched into the silicon 100 in a vertical direction a depth, x, below bottom edges of the liner 140 in the trench 120. Removal of the silicon 100 creates a cavity 150 in a portion of the trench 120 not protected by the liner 140. While the cavity 150 is shown at the bottom of trench 120 in FIG. 7, the cavity 150 may be formed in other portions of the trench 120 by changing the location of remaining portions of the liner 140. By anisotropically etching the silicon 100 below the liner 140, the width of the cavity 150 may be greater than the width of the remainder of trench 120. Thus, the cavity 150 extends the depth of the trench 120 into the silicon 100, forming trench 120', and removes the silicon 100 below the liner 140, creating a cavity 150 that is wider than trench 120'. The cavity 150 may include substantially vertical sidewalls and a substantially horizontal bottom surface 160. To form the cavity 150, the silicon 100 may be removed using processes such as reactive ion etching (RIE), vapor phase etching, or any other method known by one of ordinary skill in the art. The cavity 150 may be formed at the bottom of the trench 120. The etch may be performed to a depth, x, below the bottom of the liner 140. The depth, x, may be from about 30 nm to about 60 nm below the bottom of the liner 140. In one embodiment, the depth, x, is about 50 nm below the bottom of the liner 140.

Figure 8:
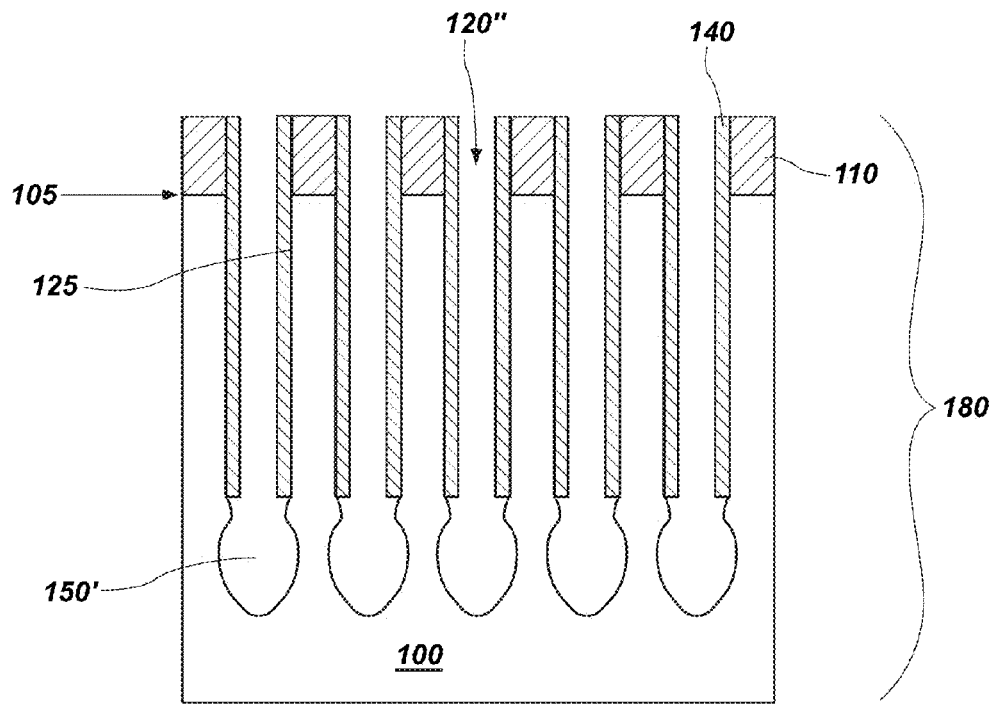

Referring to FIG. 8, a portion of the silicon 100 exposed in the cavity 150 may be removed in the horizontal and vertical directions, forming cavity 150'. The silicon 100 in the cavity 150, which is not protected by the liner 140, may be isotropically etched, changing the size and cross-sectional shape of the cavity 150. The size and shape of the cavity 150 may be controlled by removing the silicon 100, which is exposed, using a sequence of alternating acts of oxidizing the silicon 100 and removing the oxidized silicon. The bottom portion of the resulting trench 120" may have the desired bulb-shaped cross-section of cavity 150'. The oxidation may be performed with a mixture of DI $H_2O$ and $O_3$ to create a silicon oxide on a surface of the exposed silicon 100 within trench 120' (FIG. 7). The silicon oxide may include silicon oxide or silicon dioxide. Since the silicon oxide is formed by exposure to the DI $H_2O$ and $O_3$, the silicon oxide is referred to herein as being "chemically grown" silicon oxide. The chemically grown silicon oxide may then be removed with a solution of HF, exposing underlying silicon 100.

Any known method may be used to subject the exposed silicon 100 within the trench 120' to the ozonated DI $H_2O$ and the solution of HF. By way of example, an intermediate semiconductor device structure 170 of FIG. 7 may be immersed sequentially in an apparatus (e.g., a tank) of the ozonated DI $H_2O$ and the solution of HF, or the ozonated DI $H_2O$ and the solution of HF may be sprayed or dripped onto the intermediate semiconductor device structure 170, as known in the art. The intermediate semiconductor device structure 170 may be positioned in an apparatus configured to apply the DI $H_2O$ and $O_3$ and the solution of HF to the intermediate semiconductor device structure 170. The apparatus may include a tank in which the intermediate semiconductor device structure 170 is placed. The tank may be configured to contain a single intermediate semiconductor device structure 170 or a plurality of intermediate semiconductor device structures 170. The tank may be configured such that alternating cycles of oxidation and removal are performed continuously or as a batch process. Such apparatuses are known in the art and, therefore, are not described in detail herein. Each of the DI $H_2O$ and $O_3$ solution and the solution of HF may be introduced into the apparatus to contact the intermediate semiconductor device structure 170. The apparatus may be configured to allow each of the DI $H_2O$ and $O_3$ solution, the solution of HF, or any other material to flow into the apparatus in various combinations and at various times.

The silicon 100 exposed in the cavity 150 (FIG. 7) may be oxidized by contacting the silicon 100 with the ozonated DI $H_2O$. The ozone concentration in the deionized water may range from about 10 ppm to about 100 ppm. To form the mixture of DI $H_2O$ and $O_3$, $O_3$ may be flowed through DI $H_2O$ for approximately 90 seconds or until the DI $H_2O$ is saturated with $O_3$. Alternatively, the flowrate of each of the DI $H_2O$ and $O_3$ into the apparatus may be adjusted to achieve the desired concentration of $O_3$ in the DI $H_2O$. The ozonated DI $H_2O$ may flow into the apparatus at a rate of from about 10 liters per minute to about 60 liters per minute. The concentration of the ozone in the ozonated DI $H_2O$ may be easily changed by adjusting the flowrate of ozone into the apparatus. Since the solubility of ozone in DI $H_2O$ increases as the temperature of the DI $H_2O$ decreases, the DI $H_2O$ may be maintained close to room temperature (from about 20° C. to about 25° C.). Alternatively, the temperature of the DI $H_2O$ and ozone may range from about 10° C. to about 95° C.

The oxidation reaction of the silicon 100 occurs by contact between the ozonated water and the silicon 100 until a surface of the silicon 100 is saturated, which occurs at a silicon oxide thickness of from about 8 Å to about 16 Å. During this period of time, the silicon oxide (not shown) is formed on the surface of the silicon 100 at a thickness of from about 8 Å to about 16 Å. Under such preceding process conditions, the silicon 100 may be exposed to the ozonated water for between about 10 seconds and about 150 seconds.

Use of the DI $H_2O$ and ozone mixture to oxidize the silicon 100 is advantageous because the process may be performed rapidly. The rapid oxidation rate is attributed to the high reduction-oxidation (redox) potential of ozone and is advantageous because it reduces the overall manufacturing time of the semiconductor device structure 180 (FIG. 8). Additionally, ozone oxidation creates a uniform silicon oxide on the silicon surface. The uniform silicon oxide enables the silicon 100 to be removed uniformly since each alternating act of oxidation and removal removes one layer of the chemically grown silicon oxide at a time. Since the thickness of each layer of chemically grown silicon oxide is known, the amount of silicon 100 removed may be accurately controlled.

After oxidation of the silicon 100, the chemically grown silicon oxide may be removed. The oxidized silicon in the cavity 150 of the trench 120' may be removed by contacting the semiconductor device structure 180 with the solution of HF. Any known method may be used to expose the silicon oxide to the solution of HF. By way of example, the semiconductor device structure 180 may be immersed in the HF solution. Alternatively, the HF solution may be sprayed or dripped onto the semiconductor device structure 180 as known in the art. The removal of the chemically grown silicon oxide may be conducted in the same apparatus as is used for the oxidation of the silicon 100.

Figure 2:
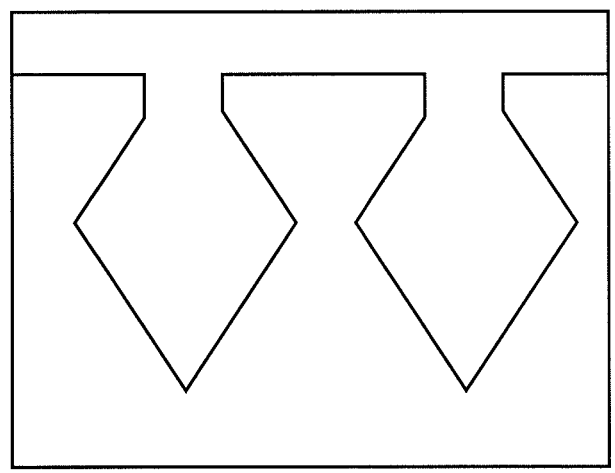
FIG. 2 is a schematic illustration showing the shape of trenches formed according to the prior art.

The alternating acts of oxidizing the silicon 100 and removing the oxidized silicon may be repeated until a desired profile of cavities 150' of the trenches 120" is achieved. Referring to FIG. 8, the cavity 150' of the trenches 120" may have substantially rounded edges after conducting the desired number of removal cycles of oxidizing the silicon 100 and removing the oxidized silicon. This is in contrast to the profile of the trenches 120' in FIG. 7, in which the cavity 150 has substantially vertical sidewalls and a substantially horizontal bottom surface 160. Furthermore, this is in contrast to the shape of trenches shown in FIG. 2 in which the etch produces sharp corners. A cross-sectional profile of the trenches 120" may have a bulb-shaped cavity 150' at a bottom portion thereof.

The removal rate of the silicon oxide may depend on the density, porosity, and composition of the silicon oxide, which is dependent on the method in which the silicon oxide is formed. The HF solution has a high selectivity to thermal grown oxides compared to the selectivity of the chemically grown silicon oxide. The HF solution also displays a high selectivity to oxides formed by CVD processes. This enables a silicon oxide liner 140 formed by CVD or thermal oxidation to remain on the silicon 100 while the silicon oxide in the cavity 150 is selectively removed to form cavity 150'. Thus, if the liner 140 is a thermally grown oxide, the liner 140 may protect the underlying silicon 100 while the chemically grown silicon oxide in the cavity 150 is etched. Alternatively, if the liner 140 is formed from silicon nitride, the HF solution may exhibit a higher selectivity to a silicon nitride liner 140 than to a chemically grown oxide liner 140.

The fluoride concentration of the HF solution is very dilute and may range from about 0.05% by weight (wt %) to about 5 wt %. In one embodiment, the concentration of the HF solution is between about 0.05 wt % and about 0.5 wt %, with the remainder of the solution including water and, optionally, another acid. The concentration of the HF may be easily changed by adjusting the flowrate of water flowing into the apparatus relative to the flowrate of the HF solution. The concentration of the HF solution may be decreased by adding water to the apparatus, which dilutes the HF solution. The HF solution may be introduced into the apparatus at a temperature of between about 10° C. and about 95° C. In one embodiment of the present disclosure, the HF solution is introduced in the apparatus at room temperature. Under such preceding conditions, the silicon 100 may be exposed to the HF solution for a period of time ranging from about 10 seconds to about 150 seconds.

The selectivity of the HF solution for removing the chemically grown silicon oxide relative to the liner 140 may be further increased by modifying the pH of the HF solution. For instance, the pH of the HF solution may be decreased by adding an acid to the HF solution. The pH of the HF solution may be adjusted by adding hydrochloric acid, sulfuric acid, phosphoric acid, or combinations thereof to the HF solution until a desired pH is achieved. The pH of the HF solution may range from about 0 to about 3.0. In one embodiment of the present disclosure, the pH of the HF solution is less than or equal to about 1.0. The lower pH of the HF solution may enable the chemically grown silicon oxide to be removed, without removing the liner 140 or the silicon 100. The decrease in pH of the HF solution had no effect on the removal rate of the chemically grown silicon oxide, but decreased the etch rate of the liner 140 and the silicon 100. Thus, the selectivity of the HF solution for removing the chemically grown silicon oxide without substantially removing the liner 140 and silicon 100 may be increased by decreasing the pH of the HF solution.

After removal of the oxidized silicon is complete, the HF solution may be removed from the apparatus. Referring to the flowchart in FIG. 9, if the cavity 150' has the desired cross-sectional profile, the removal cycles may be terminated and the semiconductor device structure 180 may be subjected to further processing. On the other hand, if the sidewalls 125 and horizontal bottom surface 160 of the cavity 150' do not have the desired cross-sectional profile, additional removal cycles may be conducted. Each oxidation and removal act of the removal cycle may last between about 20 seconds and 300 seconds and may remove between about 8 Å and about 16 Å of silicon 100. In one embodiment of the present disclosure, from six to seven removal cycles are performed to create the trenches 120" having the bulb-shaped cavity at the bottom portion thereof.

In performing the silicon removal process, the DI $H_2O$ and ozone may be purged out of the apparatus prior to introducing the HF solution into the apparatus. In another embodiment, after sufficient time for oxidation of the silicon 100, the flowrate of ozone into the apparatus may be decreased or stopped and the flowrate of HF into the apparatus may be increased to remove the chemically grown silicon oxide. Then, when the desired amount of silicon 100 has been removed, the flowrate of the HF solution into the apparatus may be decreased or stopped and ozone may be introduced into the apparatus, starting another removal cycle. The oxidation and removal acts may be repeated in cycles to create the bulb-shaped cavity at the bottom portion of the trench 120" by removing one portion of the silicon 100 at a time. In one embodiment of the present disclosure, the bottom of the trench 120" is 230 nm from the top surface of the silicon 100.

One surprising aspect of the method of the present disclosure is that the silicon 100 surrounding the cavity 150 is etched in the lateral direction at a higher rate than in the vertical direction. The other surprising aspect is that the cavity 150' formed at the bottom of the trench 120" has a rounded bottom and rounded corners, without any straight edges. The lack of straight edges or corners reduces the likelihood of semiconductor device failure and of the negative electrical consequences associated with the edge effect throughout the semiconductor device structure.

A method of forming a bulb-shaped trench in silicon is disclosed. The method comprises forming at least one trench in silicon and forming a liner in the at least one trench. The liner is removed from a bottom surface of the at least one trench to expose the underlying silicon. A portion of the underlying silicon is removed to form a cavity in the silicon. At least one removal cycle is conducted to remove silicon in the cavity to form a cavity having a bulb-shaped cross-sectional profile. Each removal cycle comprises subjecting the silicon in the cavity to ozonated water to oxidize the silicon and subjecting the oxidized silicon to a hydrogen fluoride solution to remove the oxidized silicon in the cavity.

Another method of forming a bulb-shaped trench in silicon is disclosed. The method comprises forming at least one trench extending into a portion of silicon and forming a liner in the at least one trench. The liner is removed from a bottom surface of the at least one trench to expose the underlying silicon. A depth of the at least one trench is extended into the silicon to form a cavity in the silicon. Silicon is laterally removed from sidewalls of the cavity to form a cavity having a bulb-shaped cross-sectional profile at a bottom portion of the at least one trench.

A semiconductor device structure is also disclosed. The semiconductor device structure comprises a plurality of trenches in silicon, a liner on sidewalls of the plurality of trenches, and a cavity with a bulb-shaped cross-section profile at proximal portions of the plurality of trenches.

Figure 9:
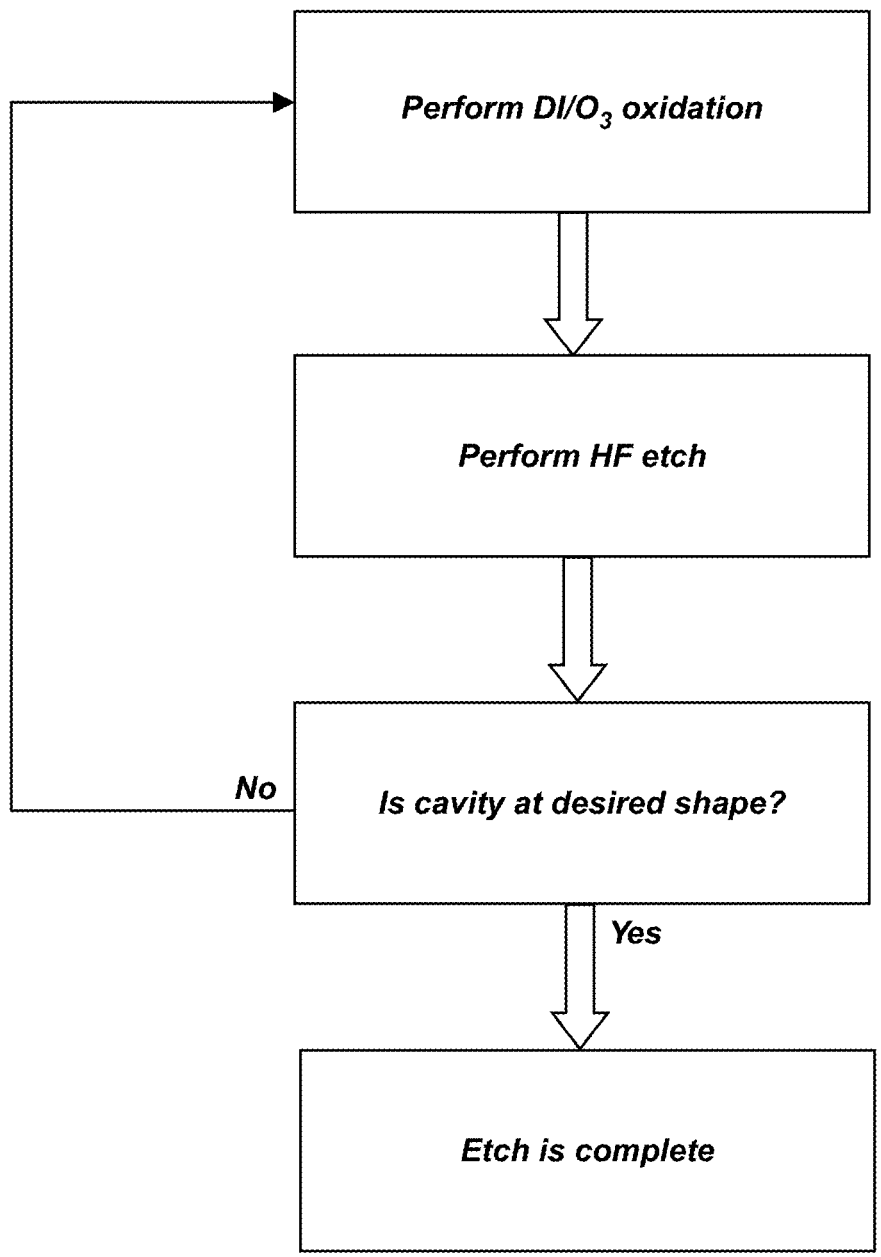
FIG. 9 is a process flow diagram of an embodiment of a method of the present disclosure for forming bulb-shaped trenches.

Referring to FIG. 9, the method of forming the trenches 120" includes alternating acts of oxidation of the silicon 100 followed by removal of the oxidized silicon. The process of oxidation and removal is repeated until the trenches 120" have the desired shape and dimensions at their inner, which may also be characterized as proximal, ends. If the trenches 120" do not have the desired size or shape, the oxidation and removal acts are repeated. Each cycle of oxidation and removal removes a small portion of the silicon 100 on the wall of the cavity 150 or 150', providing great control over the dimensions of the cavity 150' as each removal act removes a limited portion of silicon oxide material, corresponding to the removal of from about 8 Å to about 16 Å of depth of silicon material.

During the sequential oxidation and the removal acts, the silicon oxide forms to a thickness ranging from about 8 Å to about 16 Å. This provides a uniform silicon oxide across the cavity 150. Thus, when the cavity 150 is exposed to the HF solution, the silicon oxide may be uniformly etched.

The foregoing method of removing the silicon 100 inside the cavity 150 at the bottom of trenches 120' is advantageous for several reasons. First, the oxidation process is inexpensive due to the low cost of the reagents (DI $H_2O$ and $O_3$), and may be carried out at room temperature. The HF solution is also inexpensive due to the dilute nature of the solution. The increased solubility of ozone in DI $H_2O$ at lower temperatures enables the oxidation reaction to proceed rapidly when the process is conducted at room temperature. In addition, ozone is not unduly reactive with HF, enabling the oxidation act to be immediately followed by removal of the silicon oxide using the HF solution. As a result, there is a low degree of cross-contamination because the apparatus does not have to be purged, washed, or rinsed between the oxidation and removal acts. In addition, since the ozonated water and HF solution are both aqueous solutions, the concentration of ozone in the ozonated water and the concentration of HF in the HF solution may be adjusted by adjusting the flowrate of ozone and HF into the apparatus.

The silicon oxide formed by ozone exposure (e.g., the chemically grown silicon oxide) may have a lower density than either thermally grown or CVD silicon oxides. Therefore, when the chemically grown silicon oxide is exposed to the HF solution, the etch rate of this silicon oxide is significantly higher than the etch rate of the oxide or nitride of the liner 140. Therefore, the HF solution is highly selective to the oxide or nitride of the liner 140 on the sidewalls 125 of the trenches 120. This high selectivity provides controlled removal of the chemically grown silicon oxide formed in the cavity 150 without damaging the trenches 120, trenches 120', or the liners 140. This useful result reduces the potential of undercutting the silicon 100 and improves the isolation of adjacent trenches 120". Additionally, since the etch rate of the chemically grown silicon oxide in the cavity 150 is relatively fast, the amount of time that the intermediate semiconductor device structure 170 is exposed to the HF solution is minimized. The result is that the liner 140 may not be damaged by the HF solution and the silicon 100 maintains the desired profile of cavities 150' at the proximal ends of the trenches 120". In addition, because oxidation may be performed in an entirely different act than removal of the silicon oxide, the silicon 100 may not be exposed to the HF solution for an extended period of time, minimizing the damage to both the liner 140 and to the silicon 100.

Additionally, the combination of ozone oxidation with the use of an HF solution to etch the silicon oxide is beneficial for several reasons. The use of ozone for oxidation uniformly oxidizes the surface of the silicon to be etched. Then, the formed silicon oxide may be etched with the HF solution. In this manner, the amount of material removed from the silicon is controlled as the silicon is oxidized and etched, one limited portion at a time. The use of the removal cycles provides further control of the amount of silicon oxide etched because each removal cycle removes one portion of silicon oxide. In one embodiment of the present disclosure, oxidizing the silicon 100 and then removing the oxidized silicon in a separate act provides better control of the amount of silicon removed than current methods known in the art. The amount of silicon removed is controlled by adjusting the number of sequential oxidation and removal acts. The size of the cavity 150' may be controlled as each removal cycle removes between about 8 Å and 10 Å of silicon from the silicon surface.

The method of the present disclosure also reduces the likelihood of removing too much silicon from the cavity 150 of adjacent trenches 120'. By controlling the amount of silicon removed from the bottom of the trenches 120', adjacent trenches 120" may remain separated from one another, providing good isolation of the features formed in the trenches 120".

Figure 10A:
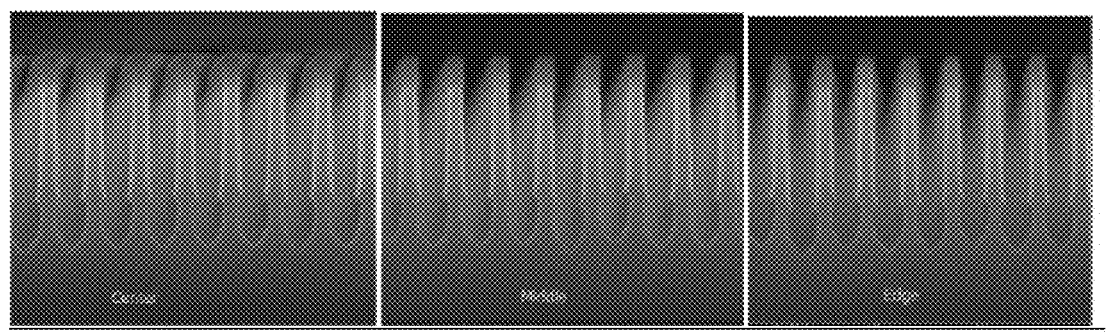
FIGS. 10A and 10B are SEMs of bulb-shaped trenches formed in silicon using an embodiment of the method of the present disclosure.
Figure 10B:
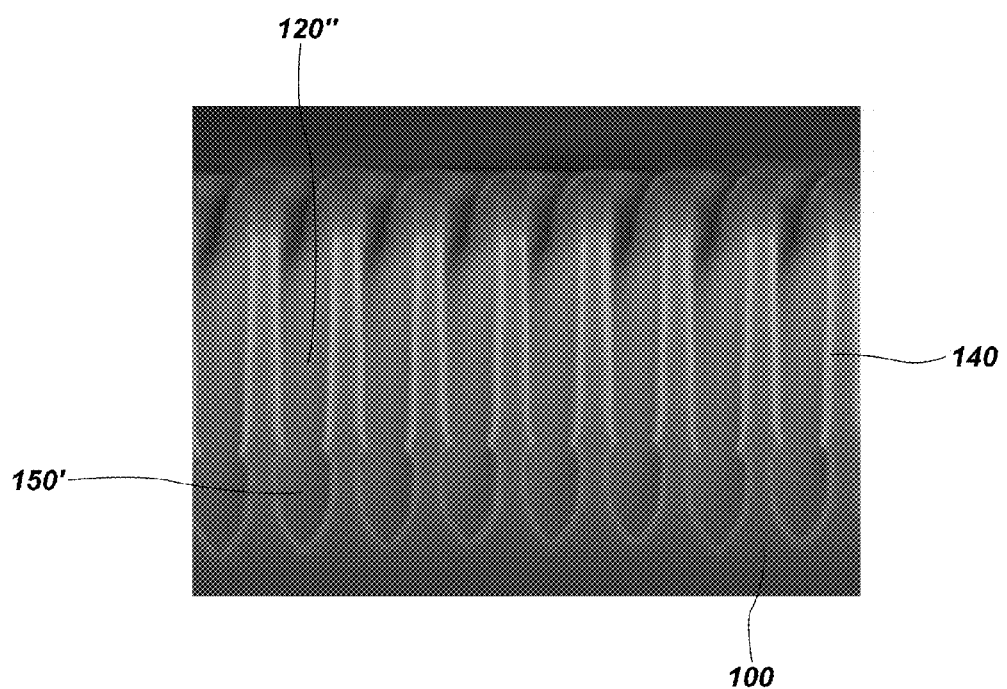

Another added advantage to the HF etchant is the resulting uniformity of the trenches 120". Referring to FIGS. 10A and 10B, the trenches 120" formed by the method of the present disclosure are uniform across the semiconductor device structure 180. The trenches 120" formed in the silicon 100 exhibit good uniformity at the center of the silicon 100, as well as at the edge of the silicon 100. Uniformity of the trenches 120" reduces the likelihood of leakage between features, such as digit lines, formed in adjacent trenches 120" and provides greater reliability in the finished semiconductor device. Good isolation between the individual trenches 120" is provided by protecting the trenches 120" with the liner 140 to which the HF solution has a high adverse selectivity. In this manner, the liner 140 may protect the silicon 100 in areas where removal is not desired.

After the bulb-shaped portion of the trench 120" is formed, the semiconductor device structure 180 may be processed depending on the particular semiconductor device to be formed. By way of example, in one embodiment of the present disclosure, a digit line (e.g., a bit line) (not shown) may be formed in the trenches 120". Since the digit lines are within the silicon 100 (e.g., below the surface of the silicon 100), a contact area for the digit line and an access line (e.g., a word line) may be saved. The digit lines may be formed in the trenches 120" and the access lines (not shown) may be formed close to the surface of the silicon 100. Thus, the digit lines may be buried beneath the surface of the silicon 100. The digit lines and the access lines may be formed by conventional techniques, which are not described in detail herein. The bulb-shaped cavity at the bottom portion of the trenches 120" may provide improved isolation of the bit lines in each trench 120", minimizing leakage between bit lines.

The present method is an effective and reliable way to control the size and shape of trenches 120". By controlling the concentration of HF, the size of the cavity 150' can be controlled. The use of DI $H_2O$ and ozone followed by the use of the HF solution provides greater control of trench uniformity than has previously been available in the industry. By controlling the flowrate and concentration of the DI $H_2O$ and ozone and the HF solution, the resulting rate of silicon 100 removal may be controlled. This allows for the continuous etching of the silicon 100 without necessarily having to purge, wash, or rinse the apparatus between acts of the removal cycle. Thus, in one embodiment of the present disclosure, after oxidation of the silicon 100 is complete, the concentration of ozone is decreased as the concentration of HF is increased. Then, to begin the next removal cycle, the concentration of HF is decreased as the ozone concentration is increased. By controlling the flowrate of the ozone and the flowrate of HF, the concentration of each reactant may be controlled for various stages of the removal cycle, thereby reducing the need to purge the apparatus between individual acts of the cycle.

While the present disclosure is susceptible to various modifications and alternative forms, specific embodiments have been shown by way of example in the drawings and have been described in detail herein. However, the present invention is not intended to be limited to the particular forms disclosed. Rather, the present invention encompasses all modifications, combinations, equivalents, and alternatives falling within the scope of the present disclosure as defined by the following appended claims and their legal equivalents.

What is claimed is:

1. A method of forming a bulb-shaped trench in silicon, comprising:
   forming at least one trench in silicon;
   forming a liner in the at least one trench;
   removing the liner from a bottom surface of the at least one trench to expose the underlying silicon;
   removing a portion of the underlying silicon to form a cavity in the silicon; and
   conducting at least one removal cycle to remove silicon in the cavity to form a cavity having a bulb-shaped cross-sectional profile, each removal cycle comprising:
   subjecting the silicon in the cavity to ozonated water to oxidize exposed silicon within the cavity; and subjecting the oxidized silicon and the liner to a hydrogen fluoride solution to remove the oxidized silicon in the cavity without removing the liner from sidewalls of the at least one trench.

2. The method of claim 1, wherein forming a liner in the at least one trench comprises conformally depositing the liner in the at least one trench.

3. The method of claim 1, wherein removing a portion of the underlying silicon to form a cavity in the silicon comprises removing a portion of the silicon exposed below the liner.

4. The method of claim 1, wherein removing a portion of the underlying silicon to form a cavity in the silicon comprises forming the cavity having vertical sidewalls and a horizontal bottom surface.

5. The method of claim 1, wherein removing a portion of the underlying silicon to form a cavity in the silicon comprises forming the cavity comprising vertical sidewalls and a horizontal bottom surface in the silicon.

6. The method of claim 1, wherein subjecting the oxidized silicon and the liner to a hydrogen fluoride solution to remove the oxidized silicon in the cavity comprises exposing the oxidized silicon and the liner to the hydrogen fluoride solution comprising from about 0.05% by weight to about 5% by weight hydrogen fluoride in deionized water.

7. The method of claim 1, wherein subjecting the oxidized silicon and the liner to a hydrogen fluoride solution to remove the oxidized silicon in the cavity comprises exposing the oxidized silicon and the liner to the hydrogen fluoride solution comprising from about 0.05% by weight to about 0.5% by weight hydrogen fluoride in deionized water.

8. The method of claim 1, wherein subjecting the oxidized silicon and the liner to a hydrogen fluoride solution further comprises adding an acid selected from the group consisting of hydrochloric acid, sulfuric acid, phosphoric acid, and combinations thereof to the hydrogen fluoride solution.

9. The method of claim 1, wherein subjecting the oxidized silicon and the liner to a hydrogen fluoride solution to remove the oxidized silicon in the cavity comprises exposing the oxidized silicon to the hydrogen fluoride solution for an amount of time ranging from about 10 seconds to about 150 seconds.

10. The method of claim 1, wherein conducting at least one removal cycle to remove silicon in the cavity to form a cavity having a bulb-shaped cross-sectional profile comprises removing between about 8 Å and about 16 Å of the oxidized silicon in the cavity with each removal cycle.

11. A method of forming a bulb-shaped trench in silicon, comprising:
   forming at least one trench extending into a portion of silicon;
   forming a liner in the at least one trench;
   removing the liner from a bottom surface of the at least one trench to expose underlying silicon;
   extending a depth of the at least one trench into the silicon to form a cavity in the silicon;
   oxidizing exposed silicon in the cavity to form silicon oxide; and
   exposing the silicon oxide and the liner to a solution to remove the silicon oxide from the cavity while the liner remains on sidewalls of the at least one trench to form a cavity having a bulb-shaped cross-sectional profile at a bottom portion of the at least one trench.

12. The method of claim 11, wherein extending a depth of the at least one trench into the silicon to form a cavity in the silicon comprises extending the at least one trench into the silicon underlying the liner.

13. The method of claim 11, wherein extending a depth of the at least one trench into the silicon to form a cavity in the silicon comprises forming the cavity having vertical sidewalls and a horizontal bottom surface in the silicon.

14. The method of claim 11, wherein exposing the silicon oxide and the liner to a solution to remove the silicon oxide from the cavity while the liner remains on sidewalls of the at least one trench comprises isotropically etching the silicon oxide in the cavity.

15. A method of forming a bulb-shaped trench in silicon, comprising:
   forming a liner on sidewalls of a trench in silicon;
   removing the silicon underlying the trench to form a cavity in the silicon; and
   conducting more than one removal cycle to remove additional silicon surrounding the cavity,
      each removal cycle comprising:
         oxidizing exposed silicon in the cavity to form a silicon oxide in the cavity; and
         subjecting the silicon oxide in the cavity to an etchant configured and formulated to remove the silicon oxide without removing the liner.

16. The method of claim 15, wherein forming a liner on sidewalls of a trench comprises forming a silicon nitride liner on sidewalls of the trench.

17. The method of claim 15, wherein conducting more than one removal cycle to remove additional silicon surrounding the cavity comprises conducting from six to seven removal cycles.

18. The method of claim 15, wherein conducting more than one removal cycle to remove additional silicon surrounding the cavity comprises removing the additional silicon from lateral surfaces of the cavity at a higher rate than from vertical surfaces of the cavity.

19. The method of claim 15, wherein subjecting the silicon oxide in the cavity to an etchant configured and formulated to remove the silicon oxide without removing the liner comprises subjecting the silicon oxide to an etchant having a pH of less than about 1.0.

20. The method of claim 15, wherein oxidizing exposed silicon in the cavity to form a silicon oxide in the cavity comprises subjecting the exposed silicon in the cavity to ozonated water.

21. The method of claim 15, wherein oxidizing exposed silicon in the cavity to form a silicon oxide in the cavity comprises forming the silicon oxide conformally on surfaces defining the cavity.

* * * * *